United States Patent [19]

Kuwata

[11] Patent Number: 5,331,410
[45] Date of Patent: * Jul. 19, 1994

[54] FIELD EFFECT TRANSISTOR HAVING A SANDWICHED CHANNEL LAYER

[75] Inventor: Nobuhiro Kuwata, Yokohama, Japan

[73] Assignee: Sumitomo Electric Industries, Ltd., Kanagawa, Japan

[*] Notice: The portion of the term of this patent subsequent to Apr. 27, 2010 has been disclaimed.

[21] Appl. No.: 871,706

[22] Filed: Apr. 21, 1992

[30] Foreign Application Priority Data

Apr. 26, 1991 [JP] Japan .................. 3-096857
Apr. 26, 1991 [JP] Japan .................. 3-096858

[51] Int. Cl.⁵ .................. H01L 29/360; H01L 29/680
[52] U.S. Cl. .................. 257/192; 257/191; 257/190; 257/194; 257/12
[58] Field of Search .............. 257/280, 192, 194, 191, 257/12, 20, 24

[56] References Cited

U.S. PATENT DOCUMENTS 4,163,237  7/1979  Dingle et al. .......... 257/20
4,691,215  9/1987  Luryi et al. ........... 257/191
5,060,030 10/1991  Hoke .................. 257/18
5,091,759  2/1992  Shih et al. ............ 257/194
5,206,527  4/1993  Kuwata ................ 257/192

Primary Examiner—Rolf Hille
Assistant Examiner—David B. Hardy
Attorney, Agent, or Firm—Beveridge, De Grandi, Weilacher & Young

[57] ABSTRACT

An FET includes an epitaxially grown n-type GaInAs channel layer, first and second undoped GaInAs layers formed to sandwich the channel layer, a buffer layer formed on a GaAs substrate to be in contact with one side of the first layer, and an undoped cap layer formed to be in contact with one side of the second layer. Each of the first and second undoped GaInAs layers is a graded layer in which the In composition ratio is gradually varied such that the In composition ratio is high on the channel layer side and is low on the buffer layer side and the cap layer side. A region in which carrier electrons are present is not entirely located on the channel layer, but a part of the region extends to the undoped GaInAs layers. For this reason, carrier electrons present in the undoped GaInAs layers are not scattered by dopant atoms, and the carrier electrons are permitted to move at high speed, thereby decreasing the source resistance and increasing the transconductance ($g_m$). High-speed operation with low noise can be achieved.

19 Claims, 4 Drawing Sheets

FIELD EFFECT TRANSISTOR HAVING A SANDWICHED CHANNEL LAYER

BACKGROUND OF THE INVENTION

1. Field of the Invention

The present invention relates to a field effect transistor (FET) operated with low noise at high speed.

2. Related Background Art

Japanese Patent Laid-Open No. 63-90861, Japanese Patent Laid-Open No. 63-272080, and Japanese Patent Laid-Open No. 64-2371 disclose techniques related to an FET using n-type GaInAs as a channel.

In these techniques, since Si is uniformly doped in GaInAs, electrons serving as carriers are scattered by Si atoms, and a sufficient overshoot-effect of drift velocity cannot be obtained and therefore sufficient characteristics to operate with low noise at high speed cannot be obtained. In Japanese Patent Laid-Open No. 63-90861, a technique for planer-doping Si in a GaInAs layer is disclosed. However, an FET having a deep gate threshold value voltage Vth cannot easily be formed by that planer-doping. For this reason, the following problems rises. That is, ① an FET having a high output cannot be formed, and ② the degree of freedom of circuit design is low.

SUMMARY OF THE INVENTION

It is an object of the present invention to provide an FET using GaInAs as a channel and operated with low noise at a speed higher than that of a conventional FET.

It is another object of the present invention to provide a field effect transistor comprising an epitaxially grown n-type GaInAs channel layer, first and second undoped GaInAs layers formed to sandwich the channel layer, a buffer layer formed by a semiconductor having an energy band gap higher than that of the first layer to be lattice-matched with the first layer and to be in contact with one side of the first layer, a cap layer formed by a semiconductor having a band gap higher than that of the second layer to be lattice-matched with the second layer and to be in contact with one side of the second layer, and a gate electrode formed to be in Schottky contact with the cap layer.

In the above field effect transistor, a three-layered structure obtained by sandwiching the n-type GaInAs channel layer between the undoped GaInAs layers is formed on a substrate through the buffer layer, and the cap layer is formed on the resultant structure. According to this field effect transistor, the region permitting carrier electrons to travel at a high speed are not only located in the channel layer, but a part of the region extends to the undoped GaInAs layers. For this reason, carrier electrons present in the undoped GaInAs layers are not scattered by dopant atoms, and the carrier electrons are permitted to travel at a high speed in the overshoot-effect. Therefore, the source resistance is decreased, and the transconductance ($g_m$) is increased. In addition, a high-speed operation with low noise can be achieved.

The buffer layer is made of GaAs, and the cap layer is made of GaAs or AlGaAs. In addition, undoped GaInAs graded layers are formed as the first and second layers. In these graded layers, the In composition ration is gradually varied such that the In composition ratio is about 0 on the junction surfaces with the buffer layer and the cap layer and it becomes substantially equal to the In composition ratio of the channel layer on the junction surfaces with the channel layer. The present invention has as its object to provide the above field effect transistor. As described above, when the graded layers are used as the first and second layers, lattice mismatches between the buffer layer, the first layer, the channel layer, the second layer, and the cap layer can be prevented, and a field effect transistor capable of achieving a high-speed operation with low noise can be obtained.

The buffer layer is made of GaAs, the cap layer is made of GaAs or AlGaAs, the first and second graded layers are made of undoped $Ga_{0.85}In_{0.15}As$, and the channel layer is made of $Ga_{0.85}In_{0.15}As$ in which an n-type impurity is doped. The present invention has as its object to provide a field effect transistor in which the total film thickness of the first layer, the channel layer, and the second layer is, e.g., about 150 Å, less than a critical film thickness at which dislocation is caused by lattice distortion. As described above, when the total film thickness is less than the critical film thickness at which dislocation is caused by lattice distortion, lattice defects can be suppressed, and a field effect transistor capable of achieving a high-speed operation with low noise can be obtained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

FIGS. 1A to 1D are sectional views showing the steps in manufacturing an FET according to an embodiment of the present invention.

Figure 1A:
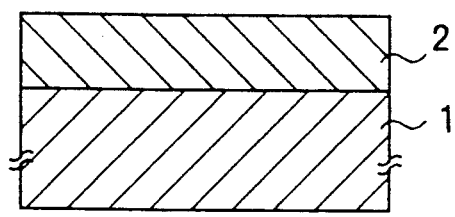
FIGS. 1A to 1D are sectional views showing the steps in manufacturing an FET according to an embodiment of the present invention.
Figure 1B:
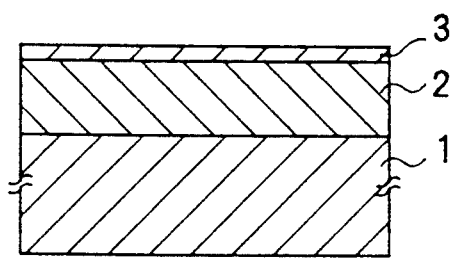
Figure 1C:
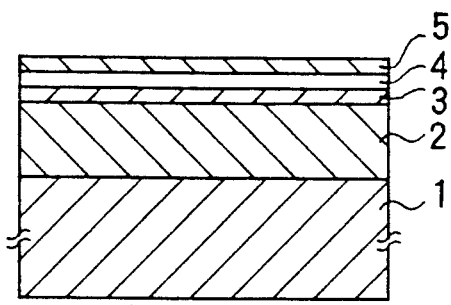

The steps according to the first embodiment of the present invention will be described below. A GaAs substrate 1 is used as a semiconductor substrate, and a buffer layer 2 (background p-type, $p = 3 \times 10^{15}$ cm$^{-3}$) which is an undoped GaAs monocrystalline layer is epitaxially grown on the GaAs substrate 1 by, e.g., an organometallic vapor phase epitaxy method (OMVPE method), to have a thickness of 5,000 Å (FIG. 1A). An undoped $Ga_{1-x}In_xAs$ graded layer 3 in which the In composition ratio X is gradually increased from GaInAs and it is set to be 0.15 on the upper most surface is grown on the resultant structure to have a thickness of 50 Å (FIG. 1B). A channel layer 4 made of n-type $Ga_{1-x}In_xAs$ ($n=4\times10^{18}$ cm$^{-3}$) and uniformly doped with Si is grown on the graded layer 3 to have a thickness of 50 Å. The In composition ratio X of the channel layer 4 is substantially equal to the In composition ratio in the upper surface of the graded layer 3, i.e., $X=0.15$. A $Ga_{1-x}In_xAs$ graded layer 5 in which the In composition ratio X is gradually decreased and the uppermost surface region is made of GaAs is formed on the channel layer 4 to have a thickness of 50 Å (FIG. 1C).

Figure 1D:
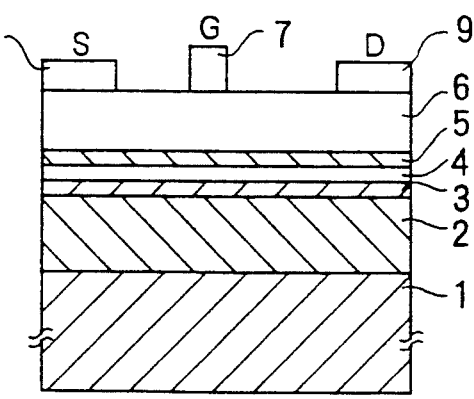

Thereafter, a cap layer 6 made of an undoped GaAs single crystal is grown on the graded layer 5 to have a thickness of 400 Å. Finally, a gate electrode 7, a source electrode 8, and a drain electrode 9 are formed on the cap layer 6, thereby constituting the FET according to this embodiment (FIG. 1D).

Figure 2A:
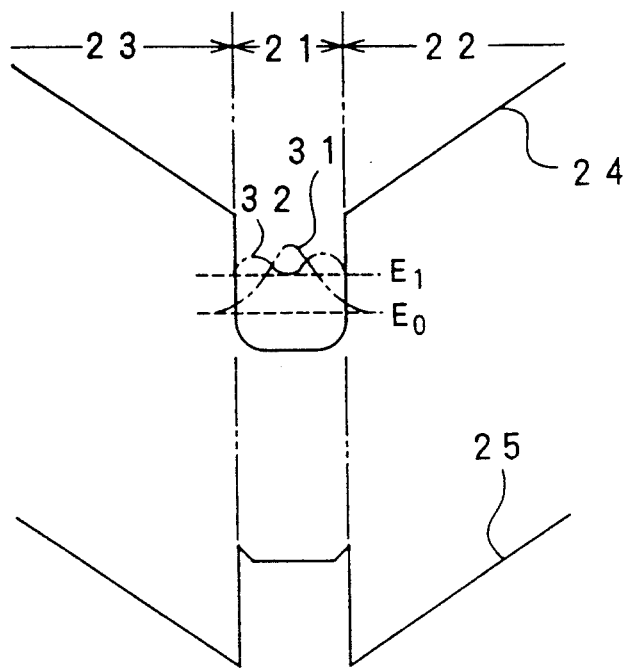
FIGS. 2A and 2B are energy band diagrams for explaining an operation of the first embodiment of the present invention.
Figure 2B:
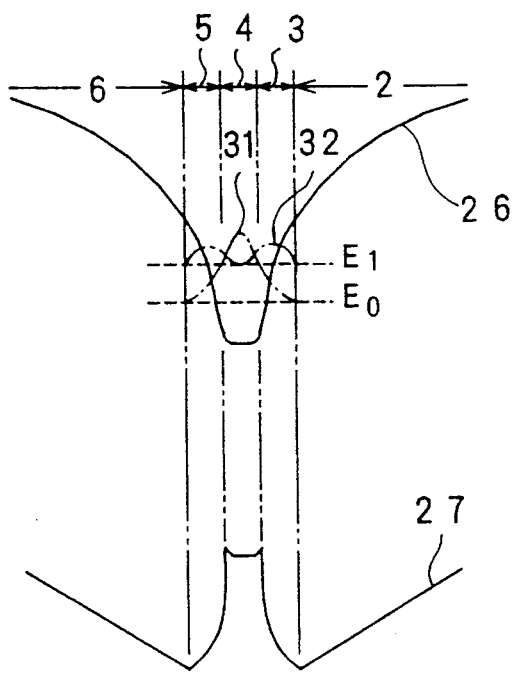

An operation of the FET manufactured as described above will be described below with reference to the energy band diagrams of FIGS. 2A and 2B. FIG. 2A is an enlarged energy band diagram showing the channel portion of a conventional n-type GaInAs channel FET uniformly doped with Si. In FIG. 2A, reference numeral 21 denotes a GaInAs channel layer; 22, a GaAs buffer layer; 23, a cap layer; 24, a conduction band level; and 25, a valence band level. FIG. 2B is an enlarged energy band diagram showing the channel portion of the n-type GaInAs channel FET of this embodiment. In this energy band diagram, parts corresponding to the epitaxial layers 2 to 6 in FIG. 1A to 1D are represented by the same reference numerals as in FIG. 2B, reference numeral 26 denotes a conduction band level, and reference numeral 27 denotes a valence band level. In FIGS. 2A and 2B, reference symbols $E_0$ and $E_1$ denote quantized energy levels, and curves 31 and 32 indicated by alternate long and short dash lines represent presence probabilities of electrons at the energy levels $E_0$ and $E_1$, respectively.

As is apparent from FIGS. 2A and 2B, in the conventional FET (FIG. 2A), a region in which carrier electrons are present is mostly located in an n-type GaInAs quantum well formed by the channel layer 21. Therefore, the carrier electrons are scattered by Si atoms in the GaInAs layer and a sufficient overshoot-effect of drift velocity cannot be obtained. For this reason, the source resistance is increased, and the transconductance ($g_m$) is decreased. In contrast to this, in the FET of this embodiment, since a part of a region in which carrier electrons are present overlaps the undoped GaInAs graded layers 3 and 5, the carrier electrons are permitted to move faster in this FET than in the conventional FET. For this reason, a low source resistance and a high transconductance ($g_m$) can be obtained.

Since the n-type GaInAs channel layer 4 which is not lattice-matched with GaAs is sandwiched between the GaInAs graded layers 3 and 5, distortion caused by a lattice mismatch can be relieved, and transportation characteristics of carrier electrons are expected to be improved.

The steps of the second embodiment will be described below with reference to the sectional views of FIGS. 1A to 1D showing the steps. A GaAs substrate 1 is used as a semiconductor substrate, and a buffer layer 2 (background p-type, $p=3\times10^{15}$ cm$^{-3}$) which is an undoped GaAs monocrystalline layer is epitaxially grown on the GaAs substrate 1 by, e.g., an organometallic vapor phase epitaxy method (OMVPE method), to have a thickness of 5,000 Å (FIG. 1A). An undoped $Ga_{1-x}In_xAs$ graded layer 3 which is not originally lattice-matched with GaAs is formed on the resultant structure to have a thickness of 50 Å (FIG. 1B). In this embodiment, an In composition ratio X of the layer 3 is set to be 0.15. A channel layer 4 made of n-type $Ga_{1-x}In_xAs$ ($n=8\times10^{18}$ cm$^{-3}$) and uniformly doped with Si is grown on the undoped $Ga_{1-x}In_xAs$ layer 3 to have a thickness of 50 Å. Note that the In composition ratio of the channel layer 4 is set to be equal to the In composition ratio of the undoped $Ga_{1-x}In_xAs$ layer 3, i.e., $X=0.15$. In addition, an undoped $Ga_{1-x}In_xAs$ layer 5 having the same composition as that of the undoped $Ga_{1-x}In_xAs$ layer 3, is formed on the channel layer 4 to have a thickness of 50 Å (FIG. 1C). Each of the epitaxial layers 3 to 5 has a thickness of 50 Å as described above, thereby obtaining a total film thickness of 150 Å. This thickness of 150 Å is smaller than a critical film thickness at which dislocation is caused by a lattice mismatch.

Thereafter, a cap layer 6 made of an undoped GaAs single crystal is grown on the undoped $Ga_{1-x}In_xAs$ layer 5 to have a thickness of 400 Å. Finally, a gate electrode 7, a source electrode 8, and a drain electrode 9 are formed on the cap layer 6, thereby constituting the FET according to this embodiment (FIG. 1D).

Figure 3A:
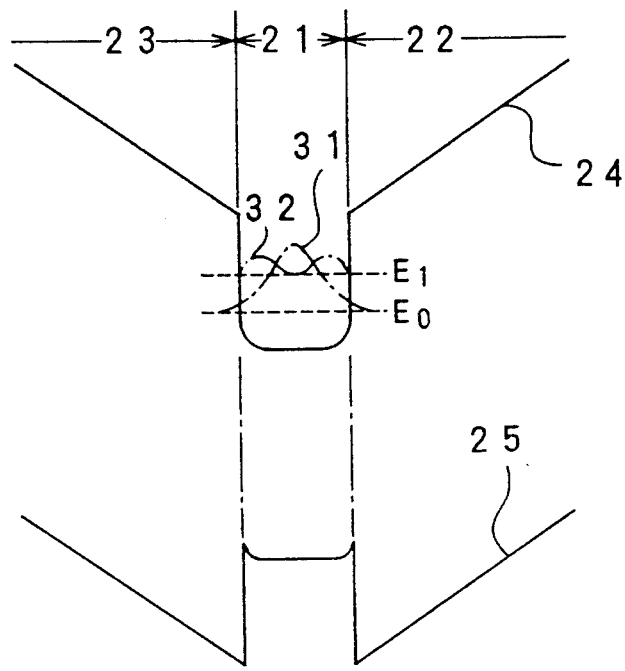
FIGS. 3A and 3B are energy band diagrams for explaining an operation of the second embodiment of the present invention.
Figure 3B:
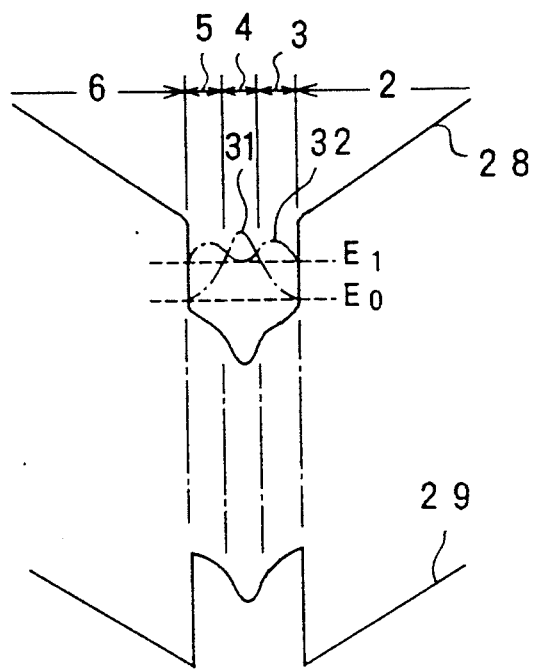

An operation of the FET manufactured as described above will be described below with reference to the energy band diagrams of FIGS. 3A and 3B. FIG. 3A is an enlarged energy band diagram showing the channel portion of a conventional n-type GaInAs channel FET uniformly doped with Si. In FIG. 2A, reference numeral 21 denotes a GaInAs channel layer; 22, a GaAs buffer layer; 23, a cap layer; 24, a conduction band level; and 25, a valence band level. FIG. 3B is an enlarged energy band diagram showing the channel portion of an n-type GaInAs channel FET of this embodiment. In this energy band diagram, parts corresponding to the epitaxial layers 2 to 6 in FIG. 3B are represented by the same reference numerals as in FIG. 1A to 1D, reference numeral 28 denotes a conduction band level, and reference numeral 29 denotes a valence band level. In FIGS. 3A and 3B, reference symbols $E_0$ and $E_1$ denote quantized energy levels, and curves 31 and 32 indicated by alternate long and short dash lines represent presence probabilities of electrons at the energy levels $E_0$ and $E_1$, respectively.

As is apparent from FIGS. 3A and 3B, in the conventional FET (FIG. 3A), a region in which carrier electrons are present is mostly located in an n-type GaInAs quantum well formed by the channel layer 21. Therefore, the carrier electrons are scattered by Si atoms in the GaInAs layer and a sufficient overshoot-effect of drift velocity cannot be obtained. For this reason, the source resistance is increased, and the transconductance ($g_m$) is decreased. In contrast to this, in the FET of this embodiment, since a part of a region in which electrons are present overlaps the undoped GaInAs graded layers 3 and 5, the carrier electrons are permitted to move faster in this FET than in the conventional FET. For this reason, a low source resistance and a high transconductance ($g_m$) can be obtained.

Although the n-type GaInAs channel layer 4 and the undoped GaInAs layers 3 and 5 which sandwich the n-type GaInAs channel layer 4 are not originally lattice-matched with GaAs, since the total thickness of the three layers is smaller than the critical film thickness at which dislocation is caused by lattice distortion, lattice defects do not occur.

Figure 4A:
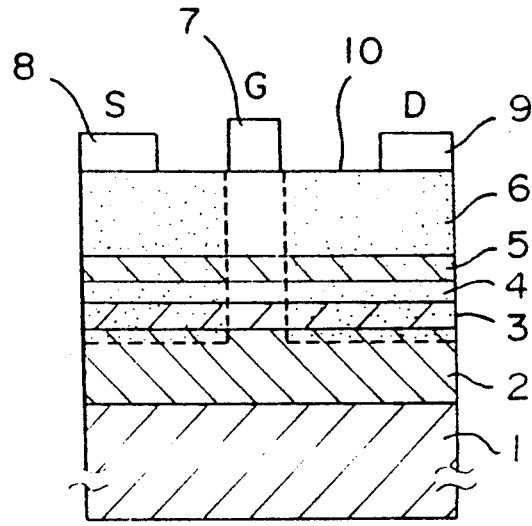
FIGS. 4A and 4B are sectional views showing a method of forming an electrode according to an embodiment of the present invention.
Figure 4B:
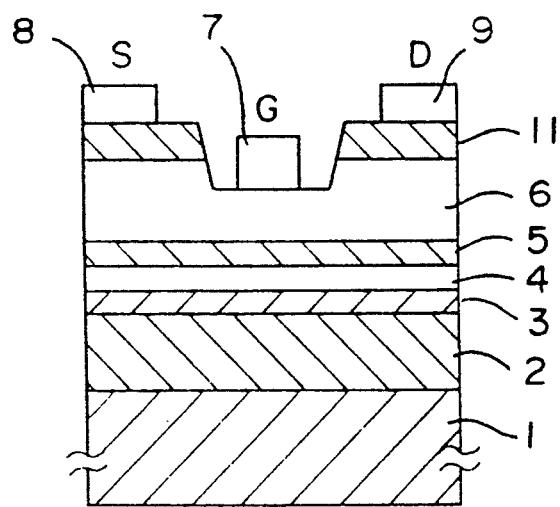

An embodiment wherein electrodes are formed is shown in FIGS. 4A and 4B.

As in the first and second embodiments, when a cap layer 6 is made of GaAs, after a gate electrode 7 is formed on the cap layer 6, Si ions are implanted to form contact regions 10 at the portions of the source electrode 8 and the drain electrode 9. The source electrode 8 and the drain electrode 9 are formed in the contact regions 10 (FIG. 4A).

Unlike the first and second embodiments, when the cap layer 6 is made of AlGaAs, GaInAs layers doped with Si or GaAs layers doped with Si are formed as contact layers 11 on the cap layer 6 at the portions of the source electrode 8 and the drain electrode 9. In addition, the gate electrode 7 is formed on the cap layer 6 having a recess structure, and the source electrode 8 and the drain electrode 9 are formed on the contact layers 11 (FIG. 4B).

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A field effect transistor comprising:
   an epitaxially grown n-type GaInAs channel layer;
   a first updoped GaInAs layer which contacts said channel layer;
   a second updoped GaInAs layer which contacts said channel layer, said first and second layers sandwiching said channel layer;
   a buffer layer formed of a semiconductor which has an energy band gap wider than that of said first layer, which is lattice-matched with said first layer, which is in contact with one side of said first layer, and which underlies said first layer;
   a cap layer formed of an undoped semiconductor which has an energy band gap wider than that of said second layer, which is lattice-matched with said second layer and which is formed on said second layer in contact with said second layer; and
   a gate electrode formed to be in Schottky contact with said cap layer.

2. A transistor according to claim 1, wherein
   said first layer is a graded layer having an In composition ratio that gradually varies such that said In composition ratio is relatively high near said channel layer and is relatively low near said buffer layer side, and
   said In composition ratio of said first layer is substantially equal to an In composition ratio of said buffer layer at said buffer layer and said first layer contact.

3. A transistor according to claim 1, wherein said second layer is a graded layer having an In composition ratio that gradually varies such that said In composition ratio is relatively high near said channel layer and is relatively low near said cap layer, and said In composition ratio of said second layer is substantially equal to an In composition ratio of said cap layer at said contact between said cap layer and said second layer.

4. A transistor according to claim 1, wherein the In composition ratio in each of said first and second layers is substantially uniform.

5. A transistor according to claim 4, wherein the In composition ratios of said first and second layers are substantially equal to an In composition ratio of said channel layer.

6. A transistor according to claim 5, wherein a total film thickness of three layers provided by said first layer, said channel layer, and said second layer is less than a critical film thickness at which dislocation is caused by lattice distortion.

7. A transistor according to claim 1, wherein said first and second layers are made of undoped $Ga_{0.85}In_{0.15}As$, and
   said channel layer is made of $Ga_{0.85}In_{0.15}As$ doped with an n-type impurity.

8. The transistor according to claim 7, wherein
   a total film thickness of three layers provided by said first layer, said channel layer, and said second layer is about 150 A.

9. A transistor according to claim 1, wherein, when a sum of a Ga composition ratio and an In composition ratio is set to be 1, said In composition ratio of GaInAs for forming said channel layer is not less than 0.1 and is not more than 0.3.

10. A transistor according to claim 9, wherein said channel layer is made of $Ga_{0.85}In_{0.15}As$.

11. A transistor according to claim 1, further comprising a source electrode and a drain electrode formed to be in ohmic contact with said cap layer.

12. A transistor according to claim 1, wherein contact layers are formed on said cap layer, and a source electrode and a drain electrode are formed on said contact layers.

13. A transistor according to claim 12, wherein said contact layers are made of one member selected from the group consisting of GaAs doped with Si and GaInAs doped with Si.

14. A transistor according to claim 1, wherein said buffer layer is formed on a semi-insulating substrate.

15. A transistor according to claim 14, wherein said semi-insulating substrate is made of GaAs.

16. A transistor according to claim 15, wherein said buffer layer is made of GaAs.

17. A transistor according to claim 1, wherein said cap layer is made of one member selected from the group consisting of GaAs and AlGaAs.

18. A field effect transistor comprising:
    an epitaxial n-type GaInAs channel layer;
    a first undoped GaInAs layer which contacts said channel layer;
    a second undoped GaInAs layer which contacts said channel layer, said first and second layers sandwiching said channel layer;
    a buffer layer formed of a semiconductor which has an energy band gap wider than that of said first layer, which is lattice-matched with said first layer, and which is in contact with one side of said first layer;
    a cap layer formed of a semiconductor which has an energy band gap wider than that of said second layer, which is lattice matched with said second layer, and which is formed on said second layer in contact with one side of said second layer;
    a gate electrode formed to be in Schottky contact with said cap layer;
    each of said first and second layers being a graded layer having an In composition ratio that gradually varies such that said In composition ratio is relatively high near said channel layer and is relatively low near said buffer layer and said cap layer.

19. A transistor according to claim 18, wherein In composition ratios of said first and second layers are equal to an In composition ratio of said channel layer at where said channel layer contacts said first and second layers.

* * * * *